(12) United States Patent
Nagakura

(10) Patent No.: US 9,601,427 B2
(45) Date of Patent: Mar. 21, 2017

(54) SEMICONDUCTOR DEVICE INCLUDING PLURAL TYPES OF RESISTORS AND MANUFACTURING METHOD OF THE SEMICONDUCTOR DEVICE

(71) Applicant: ASAHI KASEI MICRODEVICES CORPORATION, Tokyo (JP)

(72) Inventor: Kotaro Nagakura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/655,475

(22) PCT Filed: Mar. 19, 2014

(86) PCT No.: PCT/JP2014/001577
§ 371 (c)(1),
(2) Date: Jun. 25, 2015

(87) PCT Pub. No.: WO2014/156071
PCT Pub. Date: Oct. 2, 2014

(65) Prior Publication Data
US 2015/0348908 A1    Dec. 3, 2015

(30) Foreign Application Priority Data

Mar. 25, 2013 (JP) ................. 2013-062291

(51) Int. Cl.
*H01L 23/62* (2006.01)
*H01L 23/522* (2006.01)
(Continued)

(52) U.S. Cl.
CPC .... *H01L 23/5228* (2013.01); *H01L 21/32135* (2013.01); *H01L 21/32139* (2013.01);
(Continued)

(58) Field of Classification Search
CPC ......... H01L 2924/0002; H01L 2924/00; H01L 23/5228; H01L 28/20; H01L 27/016; H01L 27/0802; H01L 23/5256
(Continued)

(56) References Cited

U.S. PATENT DOCUMENTS 6,709,918 B1 * 3/2004 Ng ...................... H01L 23/5223
257/E21.004
6,893,935 B2 * 5/2005 Lachner .................. H01L 28/60
257/303

(Continued)

FOREIGN PATENT DOCUMENTS

JP    2001-320016 A    11/2001
JP    2004-507105 A    3/2004
(Continued)

OTHER PUBLICATIONS

Machine translation of JP 2010-027874 A.*
(Continued)

*Primary Examiner* — David Chen
(74) *Attorney, Agent, or Firm* — Morgan, Lewis & Bockius LLP

(57) ABSTRACT

A semiconductor device (1) includes a first metal wiring layer (11) formed on a substrate (10), an interlayer insulating film (12) formed on the first metal wiring layer (11), a second metal wiring layer (23) formed on the interlayer insulating film (12), a first resistor including a first resistance metal film (14a) formed between the first metal wiring layer (11) and the second metal wiring layer (23), a first insulating film (15a) formed on the first resistance metal film (14a), and a second resistance metal film (16a) formed on the first insulating film (15a), and a second resistor including a first resistance metal film (14b) formed between the first metal wiring layer (11) and the second metal wiring layer (23), a first insulating film (15b) formed on the first resistance metal (Continued)

film (14b), and a second resistance metal film (16b) formed on the first insulating film (15b).

7 Claims, 7 Drawing Sheets

(51) Int. Cl.
*H01L 23/528* (2006.01)
*H01L 49/02* (2006.01)
*H01L 23/532* (2006.01)
*H01L 21/3213* (2006.01)
*H01L 21/768* (2006.01)
*H01L 27/08* (2006.01)
*H01L 27/01* (2006.01)

(52) U.S. Cl.
CPC ......... *H01L 21/768* (2013.01); *H01L 23/528* (2013.01); *H01L 23/5222* (2013.01); *H01L 23/5223* (2013.01); *H01L 23/5226* (2013.01); *H01L 23/53209* (2013.01); *H01L 27/016* (2013.01); *H01L 27/0802* (2013.01); *H01L 28/20* (2013.01); *H01L 28/24* (2013.01); *H01L 28/60* (2013.01); *H01L 2924/0002* (2013.01)

(58) Field of Classification Search
USPC ....... 257/154, 350, 351, 358, 359, 363, 379, 257/380, 516, 533, 536, 537, 538, 758
See application file for complete search history.

(56) References Cited

U.S. PATENT DOCUMENTS

| | | | |
|---|---|---|---|
| 7,078,786 B1* | 7/2006 | Racanelli | H01L 27/0802 257/536 |
| 7,808,077 B2* | 10/2010 | Egashira | H01L 21/76838 257/296 |
| 8,881,379 B2* | 11/2014 | Coolbaugh | H01C 1/084 29/611 |
| 2003/0017699 A1 | 1/2003 | Zurcher et al. | |
| 2004/0238962 A1 | 12/2004 | Jung et al. | |
| 2005/0020025 A1 | 1/2005 | Yusa | |
| 2005/0130369 A1 | 6/2005 | Kim et al. | |
| 2005/0218520 A1* | 10/2005 | Kikuta | H01L 23/5223 257/758 |
| 2007/0152295 A1* | 7/2007 | Yeh | H01L 23/5223 257/516 |
| 2007/0176295 A1* | 8/2007 | Chinthakindi | H01L 23/5226 257/774 |
| 2007/0262453 A1 | 11/2007 | Toda | |
| 2009/0302993 A1 | 12/2009 | Fujiwara et al. | |
| 2011/0180901 A1* | 7/2011 | Matsumura | H01C 7/006 257/536 |
| 2012/0075029 A1 | 3/2012 | Sekine et al. | |

FOREIGN PATENT DOCUMENTS

| | | |
|---|---|---|
| JP | 2004-343125 A | 12/2004 |
| JP | 2005-012050 A | 1/2005 |
| JP | 2005-175491 A | 6/2005 |
| JP | 2007-305792 A | 11/2007 |
| JP | 2009-302082 A | 12/2009 |
| JP | 2010-027874 A | 2/2010 |
| JP | 2012-074481 A | 4/2012 |

OTHER PUBLICATIONS

International Search Report dated Apr. 15, 2014, for International application No. PCT/JP2014/001577.
International Preliminary Report on Patentability dated Oct. 8, 2015, for the corresponding International application No. PCT/JP2014/001577.

* cited by examiner

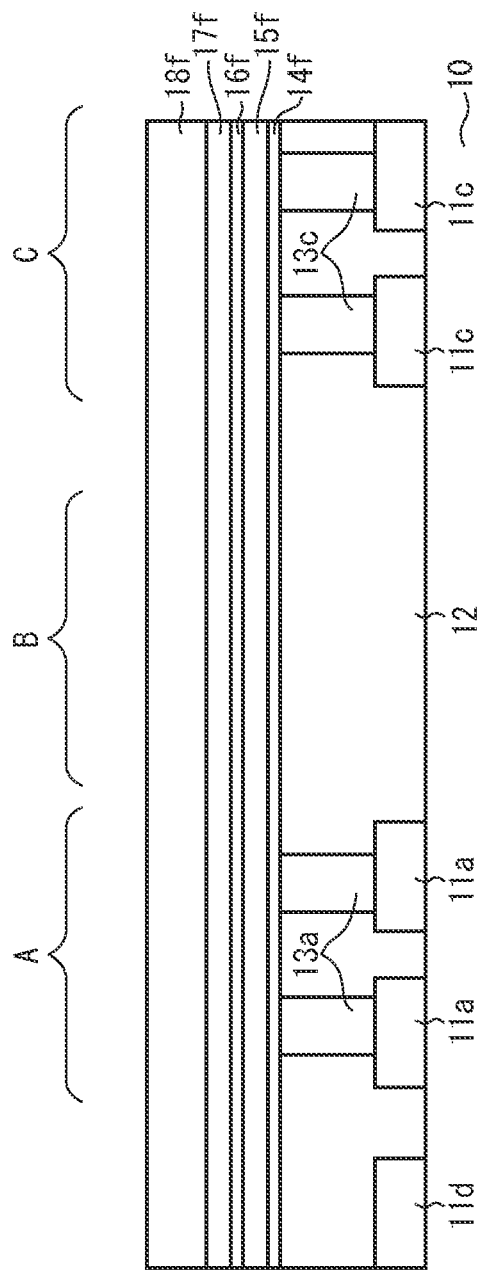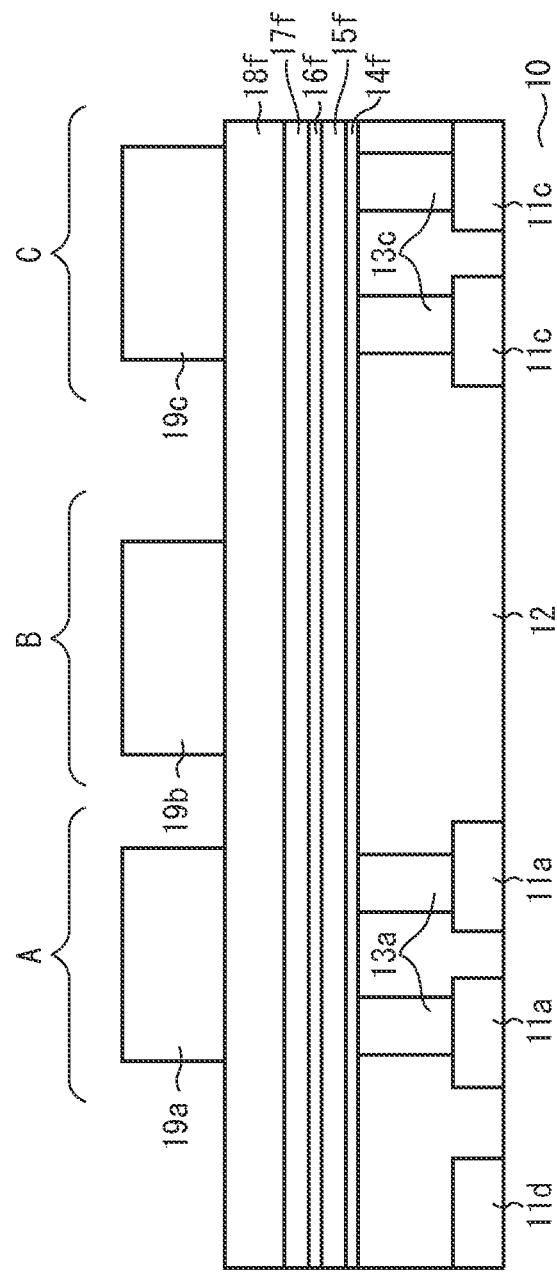
F I G. 3A
F I G. 3B

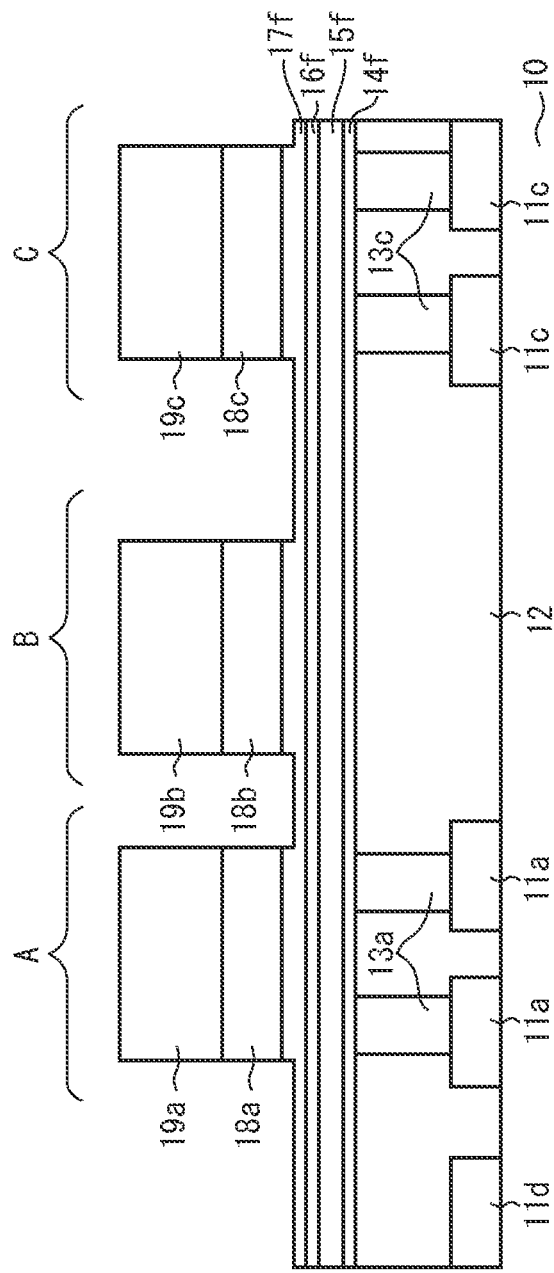
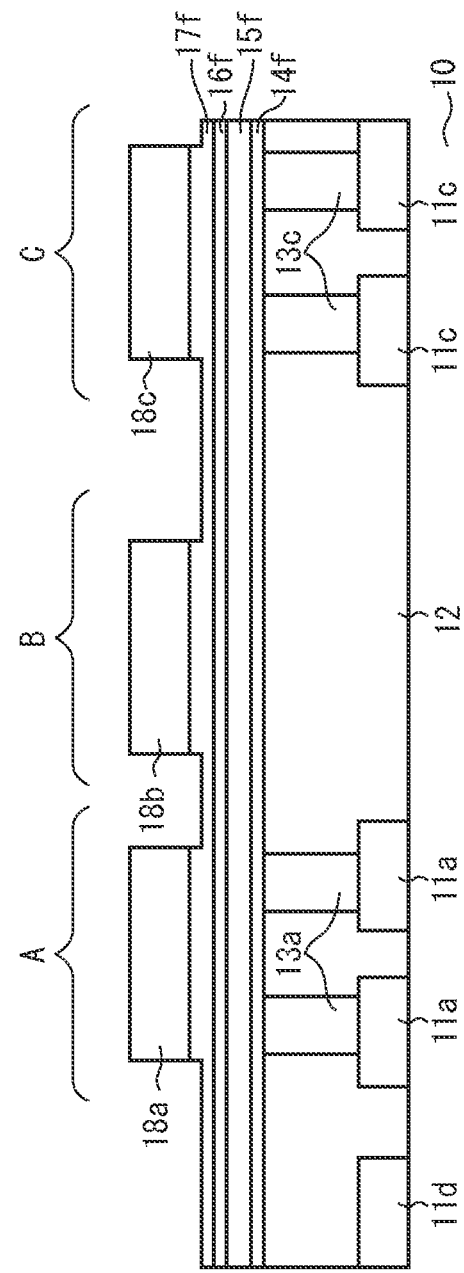
FIG. 4A
FIG. 4B

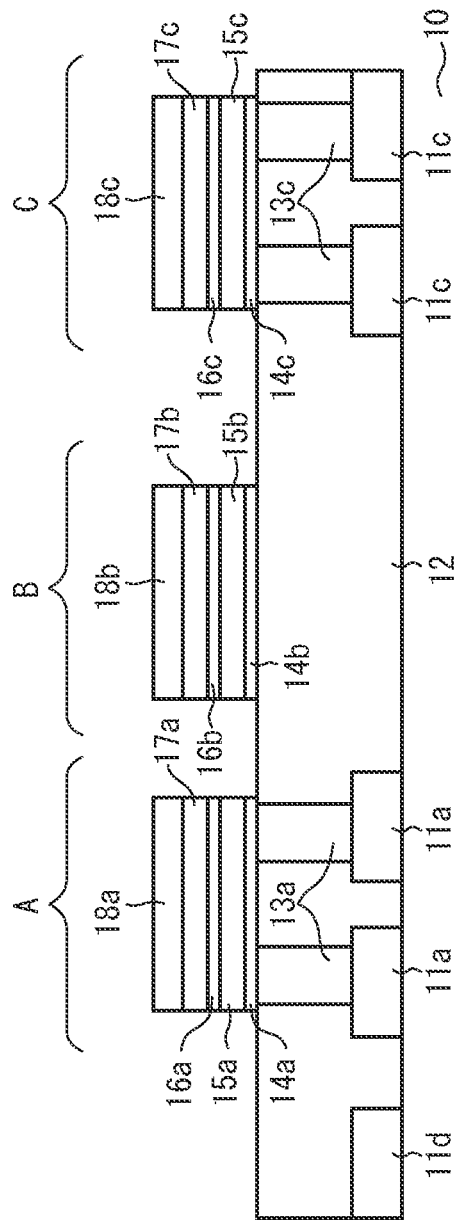
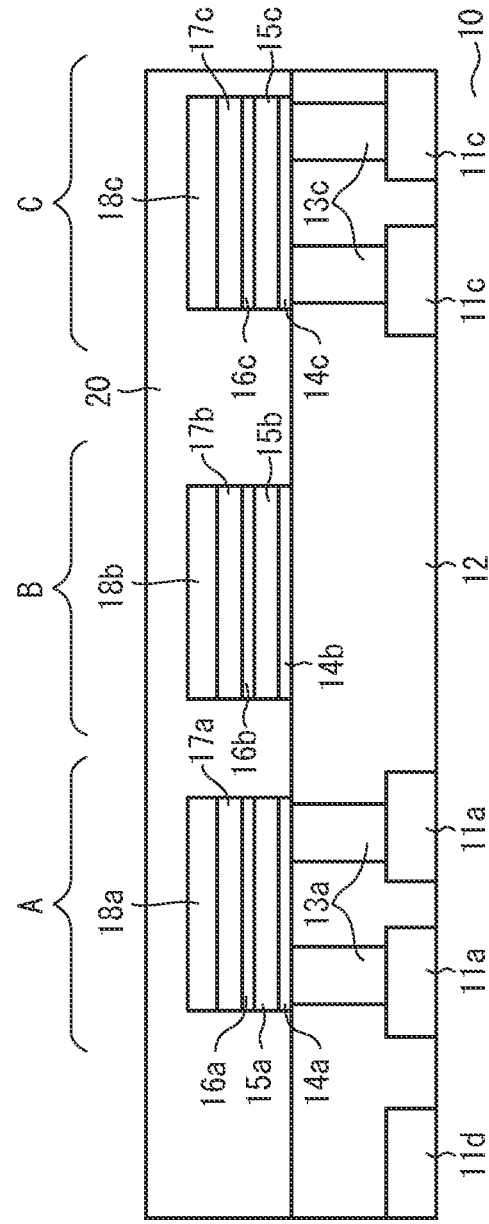
FIG. 5A
FIG. 5B

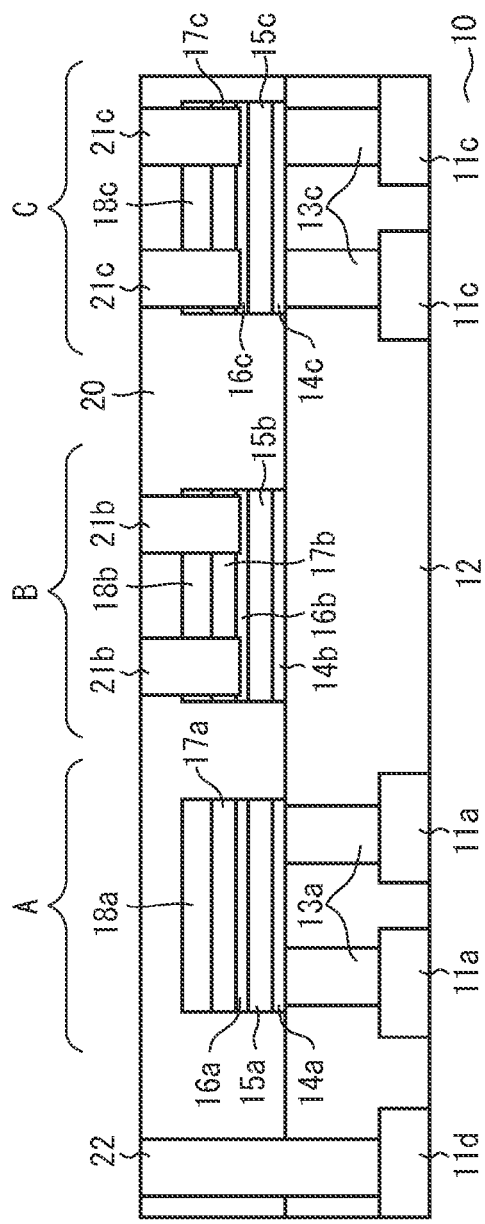
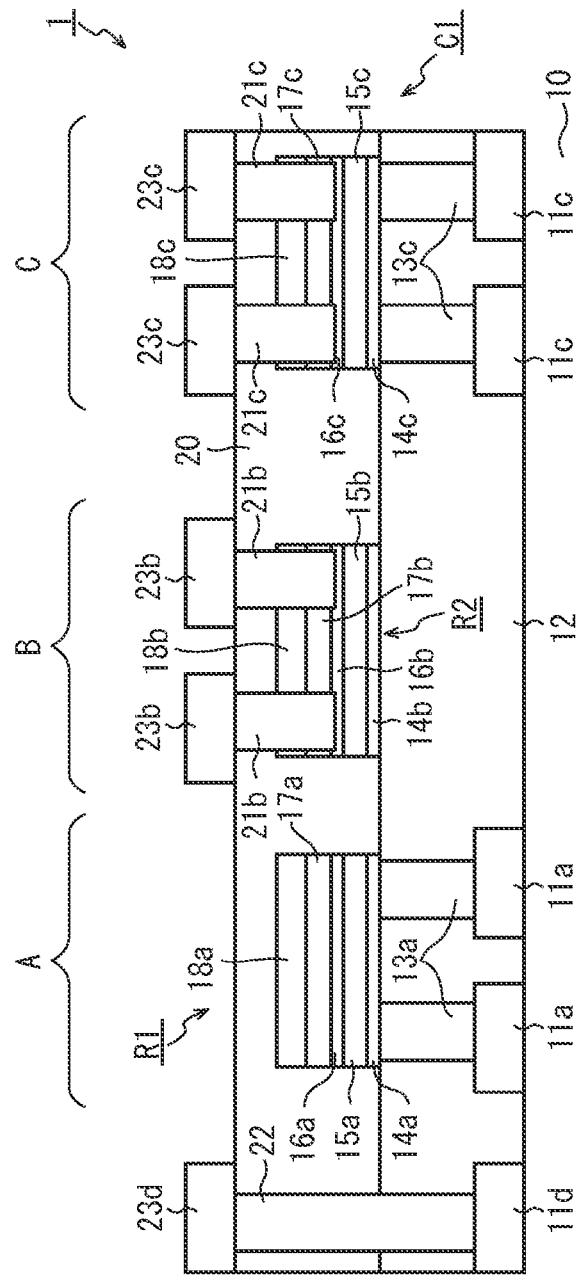
F I G. 6A
F I G. 6B

SEMICONDUCTOR DEVICE INCLUDING PLURAL TYPES OF RESISTORS AND MANUFACTURING METHOD OF THE SEMICONDUCTOR DEVICE

TECHNICAL FIELD

The present disclosure relates to a semiconductor device and a manufacturing method of the semiconductor device, and particularly to a semiconductor device including plural types of resistors on an identical substrate and a manufacturing method thereof.

BACKGROUND ART

A resistor made of tantalum nitride (TaN) (hereinafter, also referred to as "TaN resistor") is known, as a resistor that is small in frequency dependence and resistance temperature coefficient of its resistance value and that is stable about the heat in the mounting and using the resistor. A semiconductor device having such a TaN resistor is disclosed in, for example, Patent Literature 1. In addition, PLT 1 also discloses a manufacturing method of the semiconductor device.

CITATION LIST

Patent Literature

PLT 1: JP 2009-302082 A

SUMMARY

Technical Problem

However, in one technology, when two different types of resistors are fabricated, the respective resistors are fabricated in different layers, thus complicating the manufacturing process. For example, on a substrate, a first wiring layer, a first interlayer insulating layer, a second wiring layer, a second interlayer insulating layer, and a third wiring layer are formed. A first resistor is formed to be connected to the second wiring layer in the first interlayer insulating layer, and a second resistor is formed to be connected to the third wiring layer in the second interlayer insulating layer. When the process is changed from the first resistor to the second resistor, all the masks have to be replaced.

Besides, when a semiconductor device including plural types of resistors on an identical substrate is manufactured in the manufacturing method disclosed in PLT 1 (in one technology), a mask has to be formed for each type of the resistors and etching has to be carried out every time. For example, when the semiconductor device including two types of metal thin film resistors are manufactured in one technology, two kinds of masks for each type of the metal thin film resistors have to be formed. Then, the etching has to be carried out every time so that an intended semiconductor device is manufactured. Thus, there is a problem that the number of the manufacturing processes increases, in one technology, when the semiconductor device including plural types of resistors on an identical substrate is manufactured.

The present disclosure has been made in view of the above circumstances, and has an object of providing a semiconductor device and a manufacturing method thereof, by which it is possible to reduce the number of manufacturing processes of the semiconductor device including plural types of resistors on an identical substrate.

Solution to Problem

In one embodiment of the present disclosure, there is provided a semiconductor device, including: a first metal wiring layer formed on a semiconductor substrate; an interlayer insulating film formed on the first metal wiring layer; a second metal wiring layer formed on the interlayer insulating film; a first resistor including a first resistance metal film formed between the first metal wiring layer and the second metal wiring layer, a first insulating film formed on the first resistance metal film, and a second resistance metal film formed on the first insulating film and being different in a sheet resistance from the first resistance metal film; and a second resistor including a third resistance metal film formed between the first metal wiring layer and the second metal wiring layer, a second insulating film formed on the third resistance metal film, and a fourth resistance metal film formed on the second insulating film and being different in the seat resistance from the third resistance metal film; wherein the first resistance metal film and the third resistance metal film are made of a same material, and wherein the second resistance metal film and the fourth resistance metal film are made of a same material.

BRIEF DESCRIPTION OF DRAWINGS

FIG. 3A and FIG. 3B are cross-sectional views illustrative of the manufacturing method of the semiconductor device in one embodiment of the present disclosure (second views);

FIG. 4A and FIG. 4B are cross-sectional views illustrative of the manufacturing method of the semiconductor device in one embodiment of the present disclosure (third view);

FIG. 5A and FIG. 5B are cross-sectional views illustrative of the manufacturing method of the semiconductor device in one embodiment of the present disclosure (fourth view);

FIG. 6A and FIG. 6B are cross-sectional views illustrative of the manufacturing method of the semiconductor device in one embodiment of the present disclosure (fifth view)

DESCRIPTION OF EMBODIMENTS

Hereinafter, a semiconductor device and a manufacturing method of the semiconductor device will be described, in one embodiment of the present disclosure, with reference to FIG. 1 to FIG. 7.

(Semiconductor Device)

Figure 1:
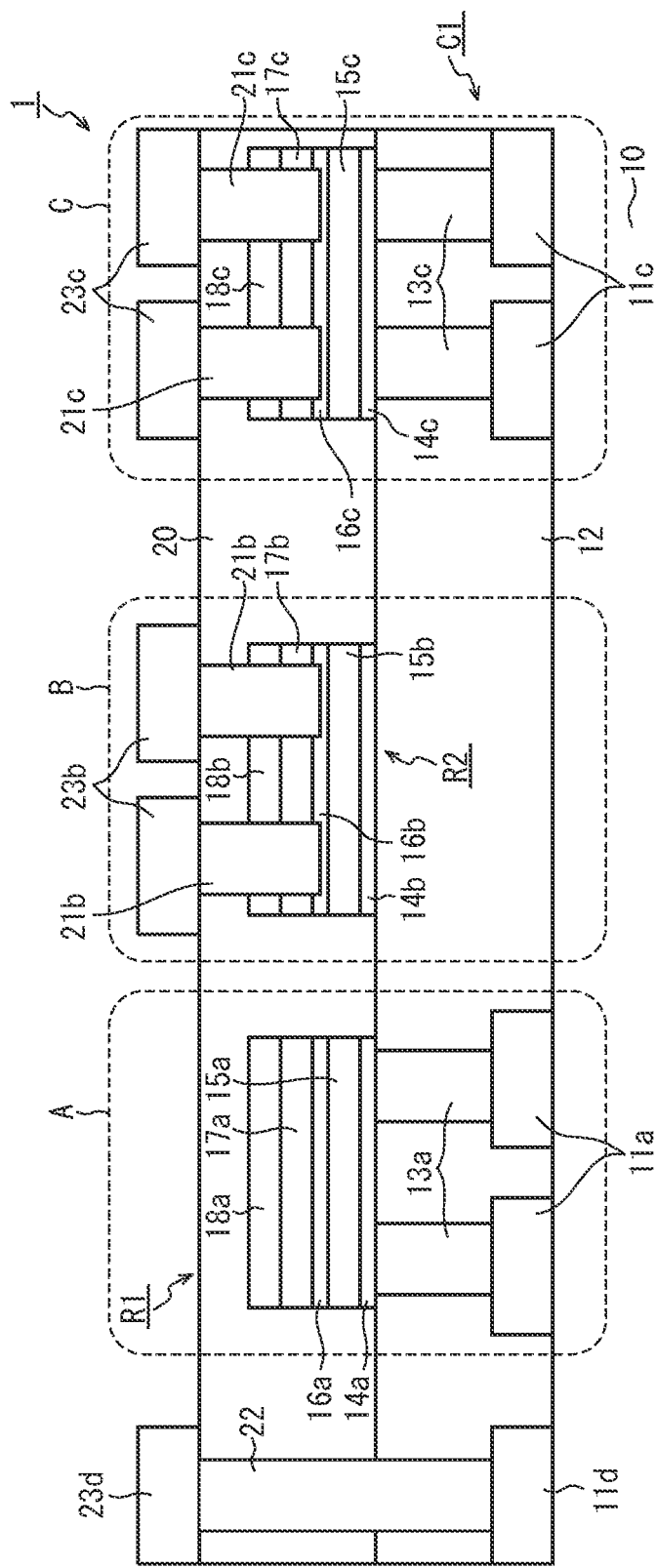
FIG. 1 is a cross-sectional view illustrative of a structure of a semiconductor device in one embodiment of the present disclosure.

FIG. 1 is a cross-sectional view illustrative of a structure of a semiconductor device in one embodiment of the present disclosure. A semiconductor device 1, in the present embodiment, virtually has three formation portions including a first resistor formation portion A, a second resistor formation portion B, and a capacitance element formation portion C. These three formation portions are indicated by broken lines in FIG. 1. Hereinafter, a description will be given of a structure of the semiconductor device 1, in which a first resistance element R1 is formed in the first resistor formation portion A, a second resistance element R2 is formed in the second resistor formation portion B, and a capacitance element C1 is formed in the capacitance element formation portion C.

The semiconductor device 1 is configured to include a substrate 10, lower wiring layers 11a, 11c, and 11d, a first interlayer insulating film 12, lower metal plugs 13a and 13c, first resistance metal films 14a to 14c, first insulating films 15a to 15c, second resistance metal films 16a to 16c, second insulating films 17a to 17c, hard masks 18a to 18c, a second interlayer insulating film 20, upper metal plugs 21b and 21c, a metal plug 22, and upper wiring layers 23b to 23d. Hereinafter, the structure of the semiconductor device 1 will be described in detail. It is to be noted that above-described first resistance metal films 14a to 14c correspond to "first resistance metal film" and "third resistance metal film", and the second resistance metal films 16a to 16c correspond to "second resistance metal film" and "fourth resistance metal film", in the present disclosure. In addition, a resistance metal film corresponding to the "first resistance metal film" and a resistance metal film corresponding to the "third resistance metal film" are made of the same material. Further, a resistance metal film corresponding to the "second resistance metal film" and a resistance metal film corresponding to the "fourth resistance metal film" are made of the same material.

(Substrate)

A substrate 10 is a substrate having insulating properties. The substrate 10 should only have the insulating properties, but the material is not limited, in particular. For example, a silicon oxide (SiO) substrate can be used for the substrate 10.

(Lower Wiring Layer)

The lower wiring layers 11a, 11c, and 11d are formed on the substrate 10. The lower wiring layers 11a are a pair of lower wiring layers formed in the first resistor formation portion A, the lower wiring layers 11c are a pair of lower wiring layers formed in the capacitance element formation portion C, and the lower wiring layer 11d is a lower wiring layer formed alone on the left side in the drawing. The lower wiring layers 11a and 11c are wiring layers used for making electric current flowing across the first resistance metal films 14a and 14c, respectively, as will be described later, and the lower wiring layer 11d is a wiring layer used for ensuring electric conduction between upper and lower layers.

The lower wiring layers 11a, 11c, and 11d are wiring layers extending from the near side of FIG. 1 toward the far side of FIG. 1, and have flat plate shapes, for example. Furthermore, the lower wiring layers 11a, 11c, and 11d have substantially same sizes. The lower wiring layers 11a, 11c, and 11d should only have conductivity, but the material is not limited, in particular. For example, an aluminum (Al) wiring layer can be used for the lower wiring layers 11a, 11c, and 11d.

(First Interlayer Insulating Film and Second Interlayer Insulating Film)

On the substrate 10 on which the lower wiring layers 11a, 11c, and 11d are formed, the first interlayer insulating film 12 covering the lower wiring layers 11a, 11c, and 11d is formed. In addition, on the first interlayer insulating film 12, the second interlayer insulating film 20 is formed to cover first resistance metal films 14a to 14c, first insulating films 15a to 15c, second resistance metal films 16a to 16c, second insulating films 17a to 17c, hard masks 18a to 18c. The first interlayer insulating film 12 and the second interlayer insulating film 20 are insulating films for electrically insulating conductive parts in the semiconductor device 1.

The first interlayer insulating film 12 and the second interlayer insulating film 20 should only have insulating properties, respectively, but the material is not limited, in particular. For example, both of the first interlayer insulating film 12 and the second interlayer insulating film 20 may be formed of SiO.

(First Resistance Metal Film and Second Resistance Metal Film)

The semiconductor device 1 includes the first resistance metal films 14a to 14c, and the second resistance metal films 16a to 16c. The first resistance metal films 14a to 14c are resistance metal films formed on the first interlayer insulating films 12 in the respective formation portions of the first resistor formation portion A, the second resistor formation portion B, and the capacitance element formation portion C.

The first insulating films 15a to 15c to be described below are formed on the first resistance metal films 14a to 14c, and the second resistance metal films 16a to 16c are formed on the first insulating films 15a to 15c, respectively. In addition, in the first resistor and the second resistor, the first resistance metal films 14a to 14c and the second resistance metal films 16a to 16c are capable of functioning as resistance elements, when electric current is flown therethrough. Further, in the capacitance element, the first resistance metal films 14a to 14c and the second resistance metal films 16a to 16c are capable of functioning as lower electrodes and upper electrodes, respectively.

The first resistance metal films 14a to 14c and the second resistance metal films 16a to 16c extend from the near side of FIG. 1 toward the far side of FIG. 1, and have thin film shapes, for example. In each of the formation portions including the first resistor formation portion A, the second resistor formation portion B, and the capacitance element formation portion C, the film thicknesses of the first resistance metal films 14a to 14c are substantially uniform. In addition, the film thicknesses of the second resistance metal films 16a to 16c are substantially uniform, too. Further, the film thicknesses of the first resistance metal films 14a to 14c may be same as those of the second resistance metal films 16a to 16c, but may be different.

The first resistance metal films 14a to 14c and the second resistance metal films 16a to 16c are made of resistance metals having different sheet resistances. Its material is not limited, in particular. In addition, the type of film (film type) forming the first resistance metal films 14a to 14c may be same as those of the second resistance metal films 16a to 16c, but may be different. For example, the first resistance metal films 14a to 14c are resistance metal films (hereinafter, also referred to as "TiN resistance metal film") made of titanium nitride (hereinafter, also referred to as "TiN"), in one embodiment, whereas the second resistance metal films 16a to 16c are TaN resistance metal films, in one embodiment. More specifically, the first resistance metal films 14a to 14c and the second resistance metal films 16a to 16c are films made of any one of, for example, a metal film, a metal nitride film, or a metal silicide film, each including TiN or TaN.

(First Insulating Film and Second Insulating Film)

The semiconductor device 1 includes the first insulating films 15a to 15c, and the second insulating films 17a to 17c. The first insulating films 15a to 15c are insulating films which are formed to cover top faces of the first resistance metal films 14a to 14c. In addition, the second insulating films 17a to 17c are insulating films which are formed to cover top faces of the second resistance metal films 16a to 16c. The first insulating films 15a to 15c and the second insulating films 17a to 17c are insulating films that protect surfaces of the above-described first resistance metal films 14a to 14c and the second resistance metal films 16a to 16c and that function as masks when the resistors are formed.

The first insulating films electrically insulate the first resistance metal films and the second resistance metal films, in the first resistor and the second resistor, respectively. In addition, the first insulating film functions as a capacitive insulating film in the capacitance element.

The first insulating films 15a to 15c and the second insulating films 17a to 17c are films that extend from the nearside of FIG. 1 toward the far side of FIG. 1, and have flat plate shapes, for example. Further, in each of the formation portions including the first resistor formation portion A, the second resistor formation portion B, and the capacitance element formation portion C, the film thicknesses of the first insulating film 15a to 15c are substantially uniform. Furthermore, the film thicknesses of the second insulating films 17a to 17c are substantially uniform, too. Moreover, the film thicknesses of the first insulating films 15a to 15c maybe same as those of the second insulating films 17a to 17c, but may be different.

For example, in a case where TiN resistance metal films are formed as the first resistance metal films 14a to 14c and TaN resistance metal films are formed as the second resistance metal films 16a to 16c, the first insulating films 15a to 15c and the second insulating films 17a to 17c may be formed of insulating films made of silicon nitride (hereinafter, also referred to as "SiN"). It is to be noted that the film type of the first insulating films 15a to 15c may be same as that of the second insulating films 17a to 17c, but may be different.

(Hard Mask)

Hard masks 18a to 18c are formed to cover top faces of the second insulating films 17a to 17c. The hard masks 18a to 18c are used for forming the first resistance metal films 14a to 14c, the second resistance metal films 16a to 16c, the first insulating films 15a to 15c, and the second insulating films 17a to 17c.

The hard masks 18a to 18c are masks extending from the near side of FIG. 1 toward the far side of FIG. 1, and have rectangular parallelepiped shapes, for example. The hard masks 18a to 18c should only have faster etching rates than those of the insulating films 17a to 17c. Its material is not limited, in particular. For example, a mask including SiO can be used for the hard masks 18a to 18c.

(Metal Plug)

The semiconductor device 1 includes lower metal plugs 13a and 13c, upper metal plugs 21b and 21c, and a metal plug 22. The lower metal plugs 13a are a pair of metal plugs for connecting the lower wiring layers 11a and the first resistance metal film 14a, and the lower metal plugs 13c are a pair of metal plugs for connecting the lower wiring layers 11c and the first resistance metal film 14c.

In addition, the upper metal plugs 21b are a pair of metal plugs for connecting the upper wiring layers 23b and the second resistance metal film 16b, as will be described later. Further, the upper metal plugs 21c are a pair of metal plugs for connecting the upper wiring layers 23c and the second resistance metal film 16c, as will be described later. Furthermore, the metal plug 22 is a metal plug for connecting the upper wiring layer 23d and the lower wiring layer 11d, as will be described later.

As described above, the lower metal plugs 13a and 13c penetrate through the first interlayer insulating film 12 in top and bottom direction of the drawing, and are metal plugs used for making electric current flowing across the first resistance metal films 14a and 14c. In addition, the upper metal plugs 21b and 21c penetrate through the second interlayer insulating film 20, the hard masks 18b and 18c, and the second insulating films 17b and 17c in the top and bottom direction of the drawing, and are metal plugs used for making electric current flowing across the second resistance metal films 16b and 16c, respectively. Further, the metal plug 22 penetrates through the first interlayer insulating film 12 and the second interlayer insulating film 20 in the top and bottom direction of the drawing, and is a metal plug used for ensuring electric conduction between the upper and lower layers.

The lower metal plugs 13a and 13c and the upper metal plugs 21b and 21c are metal plugs having rectangular parallelepiped shapes, and the lower metal plugs 13a and 13c and the upper metal plugs 21b and 21c have substantially same sizes.

The lower metal plugs 13a and 13c and the upper metal plugs 21b and 21c may be formed of the same material or different materials, as far as each material has a conductive property. For example, both of the lower metal plugs 13a and 13c and the upper metal plugs 21b and 21c may be formed of tungsten (W). It is to be noted that the "metal plug" is a member also called "via".

(Upper Wiring Layer)

The upper wiring layers 23b, 23c, and 23d are formed on the second interlayer insulating film 20. The upper wiring layers 23b are a pair of upper wiring layers connected with the upper metal plugs 21b, respectively. In addition, the upper wiring layers 23c are a pair of upper wiring layers connected with the upper metal plugs 21c, respectively. Further, the upper wiring layer 23d is an upper wiring layer connected with the metal plug 22. The upper wiring layers 23b and 23c are wiring layers used for making electric current flowing across the second resistance metal films 16b and 16c, respectively. The upper wiring layer 23d is a wiring layer used for ensuring electric conduction between the upper and lower layers.

The upper wiring layers 23b to 23d should only have conductive properties, and its material is not limited, in particular. For example, an Al wiring layer can be used for the upper wiring layers 23b to 23d.

(First Resistor)

As described above, since the first resistance metal film 14a formed in the first resistor formation portion A is connected to the lower wiring layers 11a through the lower metal plugs 13a, the first resistance metal film 14a functions as the first resistor in the semiconductor device 1. On the other hand, since the second resistance metal film 16a formed in the first resistor formation portion A is electrically insulated, the second resistance metal film 16a is a so-called dummy resistor that does not function as a resistor in the semiconductor device 1. Thus, the resistance element R1 including the first resistance metal film 14a is formed in the first resistor formation portion A. In other words, the resistance element R1, into which the electric current is introduced from a lower part of the semiconductor device 1, is formed in the first resistor formation portion A.

(Second Resistor)

In addition, since the second resistance metal film 16b formed in the second resistor formation portion B is connected to the upper wiring layer 23b through the upper metal plug 21b, the second resistance metal film 16b functions as the second resistor in the semiconductor device 1. On the other hand, since the first resistance metal film 14b formed in the second resistor formation portion B is electrically insulated, the first resistance metal film 14b is a so-called dummy resistor that does not function as a resistor in the semiconductor device 1. Thus, the resistance element R2 including the second resistance metal film 16b is formed in the second resistor formation portion B. In other words, the resistance element R2, into which the electric current is introduced from an upper part of the semiconductor device 1, is formed in the second resistor formation portion B.
(Capacitance Element)

Further, the first insulating film 15c formed in the capacitance element formation portion C is interposed between the first resistance metal film 14c connected to the lower wiring layer 11c through the lower metal plug 13c and the second resistance metal film 16c connected to the upper wiring layer 23c through the upper metal plug 21c, and functions as a capacitance film. Accordingly, in the capacitance element formation portion C, the capacitance element C1 configured with the first resistance metal film (lower electrode) 14c, the first insulating film (capacitance film) 15c, and the second resistance metal film (upper electrode) 16c. In other words, the capacitance element C1 is a capacitance element formed by combining the structure of the resistance element R1 with the structure of the resistance element R2.

In the semiconductor device 1 in the present embodiment, as described above, it is made possible to easily change which one of the resistance value of the first resistance metal film or the resistance value of the second resistance metal film is made available, by changing the location of the upper metal plug or the lower metal plug.
(Manufacturing Method of Semiconductor Device)

Figure 7:
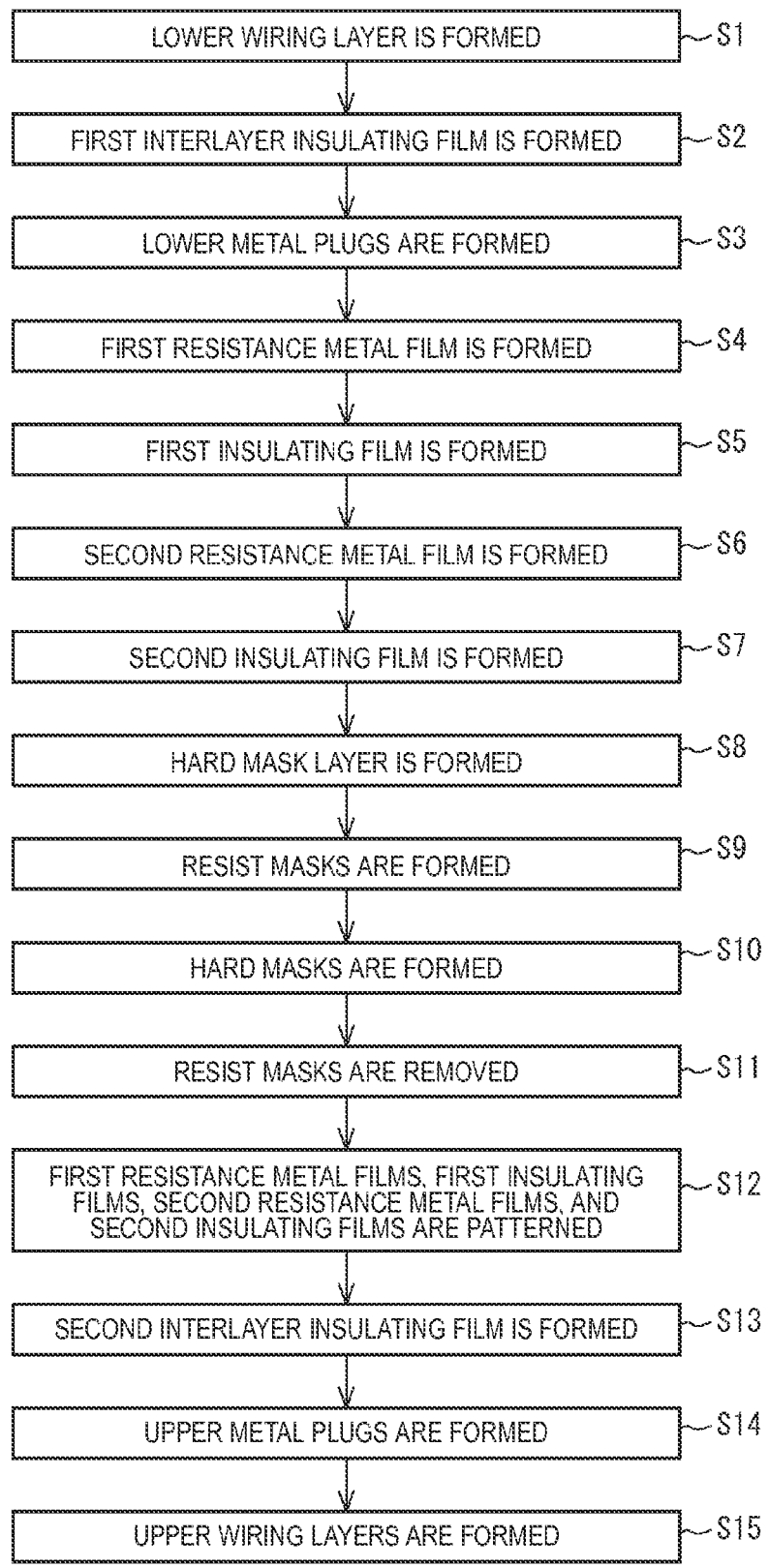
FIG. 7 is a view illustrative of a flow of the manufacturing method of the semiconductor device in one embodiment of the present disclosure.

FIG. 2A to FIG. 6B are cross-sectional views schematically illustrative of each process of the manufacturing method of the semiconductor device in one embodiment of the present disclosure. In addition, FIG. 7 is a view illustrative of a flow of the manufacturing method of the semiconductor device in one embodiment of the present disclosure.

Each process of the manufacturing method of semiconductor device 1, in one embodiment of the present disclosure, will be described below.

Figure 2A:
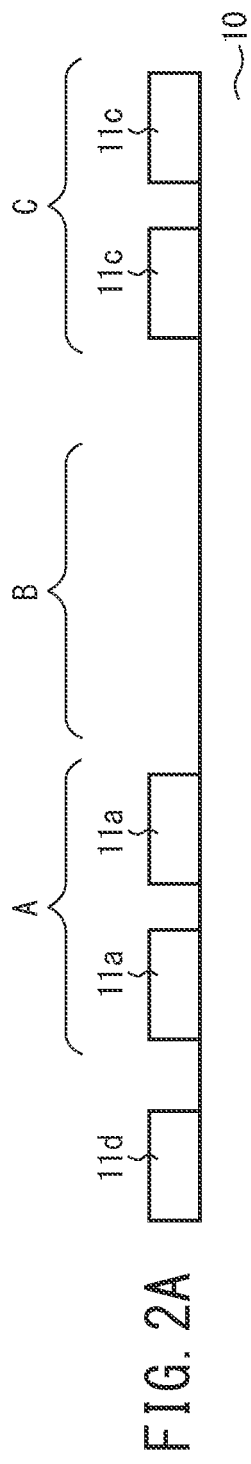
FIG. 2A to FIG. 2C are cross-sectional views illustrative of a manufacturing method of the semiconductor device in one embodiment of the present disclosure (first view)

Firstly, as illustrated in FIG. 2A, the lower wiring layers 11a and 11c are formed in each formation portion of the first resistor formation portion A and the capacitance element formation portion C on the substrate 10, and in addition, the lower wiring layer 11d is formed (S1). After a metal film (not illustrated) is formed on the substrate 10, the lower wiring layers 11a, 11c, and 11d are formed by patterning the metal film. A well-known technology can be used for the patterning. For example, when the Al wiring layer is formed as the lower wiring layers 11a, 11c, and 11d, the Al layer is formed on the substrate 10, and then the Al layer is patterned by use of the photolithography method and dry etching method. It is to be noted that the above-described lower wiring layer corresponds to "first metal wiring layer" in the present disclosure.

Figure 2B:
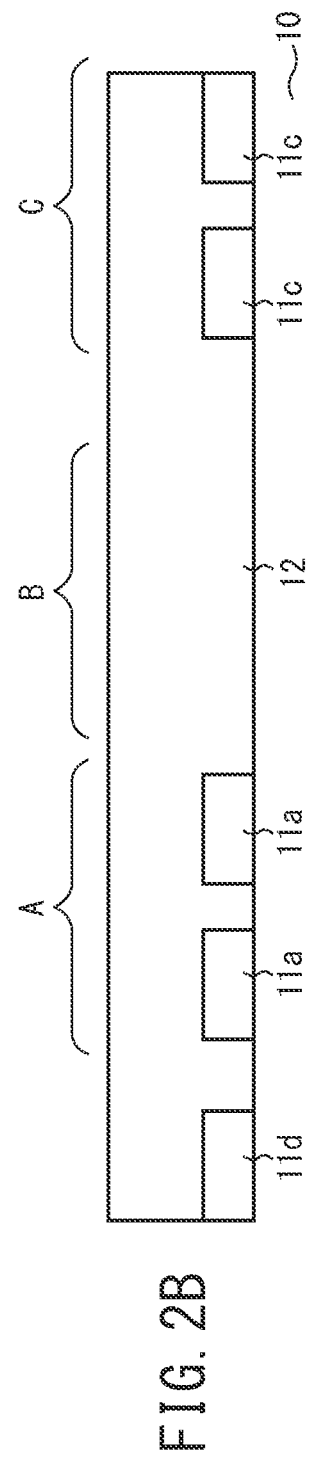

Next, as illustrated in FIG. 2B, the first interlayer insulating film 12 is formed in the substrate 10 on which the lower wiring layers 11a, 11c, and 11d are formed (S2). A well-known technology can be used for the formation of the first interlayer insulating film 12. For example, the CVD (Chemical Vapor Deposition) method is used in the formation of an SiO film as the first interlayer insulating film 12. It is to be noted that FIG. 2B illustrates a state where after the first interlayer insulating film 12 is formed, its surface is planarized.

Next, in each formation portion of the first resistor formation portion A and the capacitance element formation portion C, the first via hole that penetrates through the first interlayer insulating film 12 and reaches the lower wiring layers 11a and 11c is formed in a single etching process (not illustrated). A well-known technology can be used for the formation of the first via hole. For example, the first via hole may be formed by carrying out the etching process, after a mask (not illustrated) is formed in a region other than the region where the first via hole is formed, on the first interlayer insulating film 12.

Figure 2C:
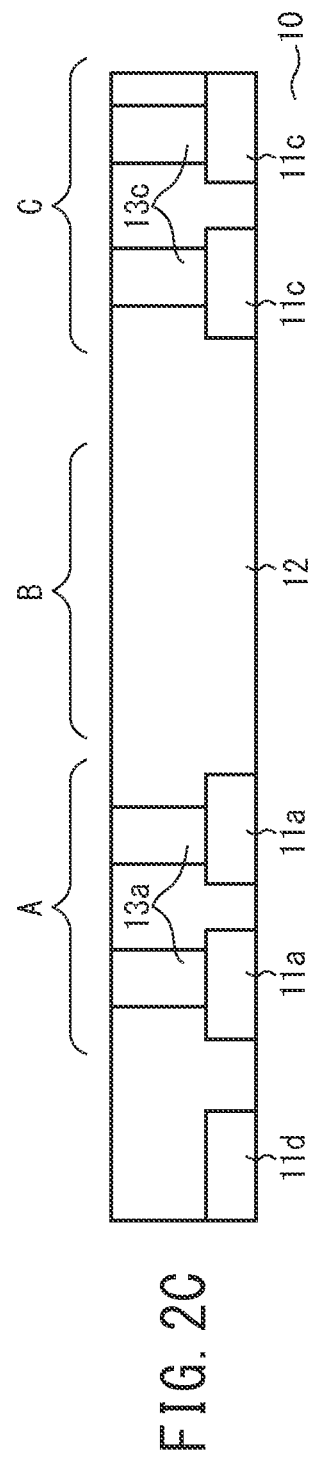

Next, a conductive material is filled in the first via hole that has been formed as described above, and as illustrated in FIG. 2C, the lower metal plugs 13a and 13c are formed (S3). It is to be noted that FIG. 2C illustrates a state where after the lower metal plugs 13a and 13c are formed, their surfaces are planarized. In addition, the above-mentioned lower metal plug corresponds to "first metal plug" in the present disclosure.

Next, as illustrated in FIG. 3A, on the first interlayer insulating film 12 in which the lower metal plugs 13a and 13c are formed, the first resistance metal film 14f for the first resistance metal films 14a to 14c or the first resistance metal film 14f for the lower electrode is formed (S4). A well-known technology can be used for the formation of the first resistance metal film 14f. For example, when a TiN resistance metal film is formed as the first resistance metal films 14a to 14c, a TiN film is formed as the first resistance metal film 14f. For example, the PVD (Physical Vapor Deposition) method, the CVD method, or the ALD (Atomic Layer Deposition) method is used for the formation of the TiN film.

Next, the first insulating film 15f for the first insulating films 15a to 15c is formed on the first resistance metal film 14f (S5). A well-known technology can be used for the formation of the first insulating film 15f. For example, when a SiN film is formed as the first insulating film 15f, the CVD method is used.

Next, the second resistance metal film 16f for the second resistance metal films 16a to 16c or the upper electrode of the capacitance element is formed on the first insulating film 15f (S6). A well-known technology can be used for the formation of the second resistance metal film 16f.

For example, when a TaN resistance metal film is formed as the second resistance metal films 16a to 16c, a TaN film is formed as the second resistance metal film 16f. For example, the PVD method, the CVD method, or the ALD method is used for the formation of the TaN film.

Then, the second insulating film 17f for the second insulating films 17a to 17c is formed on the second resistance metal film 16f (S7). A well-known technology can be used for the formation of the second insulating film 17f. For example, when a SiN film is formed as the second insulating film 17f, the CVD method is used.

Next, an oxide film (hard mask layer) 18f for the hard masks 18a to 18c is formed on the second insulating film 17f (S8). A well-known technology can be used for the formation of the oxide film 18f. For example, when an SiO film is formed as the oxide film 18f, the CVD method is used.

Next, as illustrated in FIG. 3B, the resist masks 19a to 19c are formed in each formation portion of the first resistors formation portion A, the second resistors formation portion B, and the capacitance element formation portion C (S9). A well-known technology can be used for the formation of the resist masks 19a to 19c. For example, the resist masks 19a to 19c can be formed by use of the photolithography method.

Then, as illustrated in FIG. 4A, the oxide film 18f is etched by use of the resist masks 19a to 19c in a single process. A well-known technology can be used for this etching process. For example, the oxide film 18f is dry etched by use of, for example, a Freon-based gas. Thus, on the second insulating film 17f in each formation portion of the first resistors formation portion A, the second resistors formation portion B, and the capacitance element formation portion C, the hard masks 18a to 18c are formed in a single etching process (S10). In other words, the hard masks 18a to 18c are formed by use of one kind of the resist masks 19a to 19c in a single etching process.

Next, as illustrated in FIG. 4B, the resist masks 19a to 19c are removed (S11). A well-known technology can be used for the removal of the resist masks 19a to 19c. For example, when the resist masks 19a to 19c are masks of organic polymer as a main component, the resist masks 19a to 19c are removed by use of oxygen plasma.

Then, by use of the hard masks 18a to 18c, the second insulating film 17f, the second resistance metal film 16f, the first insulating film 15f, and the first resistance metal film 14f are continuously etched in a sequential manner. A well-known technology can be used for the etching. For example, the above laminated film is etched by using a halogen-based gas in a single process. In other words, in a single etching process, as illustrated in FIG. 5A, in each formation portion of first resistors formation portion A and second resistors formation portion B and capacitance element formation portion C, the first resistance metal films 14a to 14c, the first insulating films 15a to 15c, the second resistance metal films 16a to 16c, and the second insulating films 17a to 17c are formed at the same time (S12).

Next, as illustrated in FIG. 5B, the first resistance metal films 14a to 14c, the first insulating films 15a to 15c, the second resistance metal films 16a to 16c, the second insulating films 17a to 17c, and the hard masks 18a to 18c form the second interlayer insulating film 20 on the first interlayer insulating film 12 that has been laminated and formed (S13). A well-known technology can be used for the formation of the second interlayer insulating film 20. For example, when an SiO film is formed as the second interlayer insulating film 20, the CVD method is used.

Then, the second interlayer insulating film 20, the hard masks 18b and 18c, and the second insulating films 17b and 17c are penetrated through each of the second resistor formation portion B and the capacitance element formation portion C, so that a second via hole that reaches the second resistance metal films 16b and 16c is formed in a single etching process (not illustrated). A well-known technology can be used for the formation of the second via hole. For example, the second via hole may be formed by carrying out the etching process, after a mask (not illustrated) is formed in a region other than the region where the second via hole is formed, on the second interlayer insulating film 20.

Next, a conductive material is filled in the second via hole that has been formed in this way, the upper metal plugs 21b and 21c are formed (S14), as illustrated in FIG. 6A. It is to be noted that FIG. 6A illustrates a state where after the upper metal plugs 21b and 21c are formed, their surfaces are planarized. In addition, the above-described upper metal plug corresponds to "second metal plug" in the present disclosure.

In the present embodiment, at the same time with the formation of the second via hole, a third via hole (not illustrated) that penetrates through the first interlayer insulating film 12 and the second interlayer insulating film 20 and reaches the lower wiring layer 11d is formed. Then, at the same time that a conductive material is filled in the second via hole, the conductive material is filled in the third via hole. Thus, the metal plug 22 is formed.

In the present embodiment, the material of the first interlayer insulating film 12 and the second interlayer insulating film 20 is different from that of the second insulating films 17a to 17c. For this reason, the etching rate of the first interlayer insulating film 12 and the second interlayer insulating film 20 is different from that of the second insulating films 17a to 17c. More specifically, the etching rate of the first interlayer insulating film 12 and the second interlayer insulating film 20 is faster than that of the second insulating films 17a to 17c. Accordingly, by adjusting the film thickness of the second insulating films 17a to 17c (i.e., the film thickness of the second insulating film 17f) beforehand, the time necessary for the formation of the second via hole and the time necessary for the formation of the third via hole can be matched with each other. In this manner, in a single etching process, the second via hole and the third via hole can be formed at the same time.

Lastly, as illustrated in FIG. 6B, on the second interlayer insulating film 20 where the upper metal plugs 21b and 21c and the metal plug 22 are formed, upper wiring layers 23b to 23d are formed (S15). The upper wiring layers 23b to 23d are formed by forming a metal film (not illustrated) on the second interlayer insulating film 20 and then patterning the metal film. A well-known technology can be used for the patterning. For example, when Al wiring layers are formed as the upper wiring layers 23b to 23d, Al layers are formed on the second interlayer insulating film 20, and then patterning is carried out by using the photolithography method and dry etching method, and therefore the Al wiring layers are formed. It is to be noted that the above-mentioned upper wiring layer corresponds to "second metal wiring layer" in the present disclosure.

The semiconductor device 1 illustrated in FIG. 1 can be manufactured by carrying out the above-described processes.

Here, a focus is given to the manufacturing process of the capacitance element C1 formed in the above-described capacitance element formation portion C. The capacitance element C1 in the present embodiment is a capacitance element manufactured by carrying out a manufacturing process of the first resistance element R1, and a manufacturing process of the second resistance element R2. In other words, the first resistance element R1 is manufactured, and then the upper metal plug and the upper wiring layers are formed in the first resistance element R1. Thus, the capacitance element C1 can be manufactured.

(Effects)

(1) In the manufacturing method of the semiconductor device 1 in the present embodiment, on the first interlayer insulating film 12, the first resistance metal film 14f, the first insulating film 15f, the second resistance metal film 16f, and the second insulating film 17f are laminated sequentially, and on such a laminated structure, one kind of the hard masks 18a to 18c is formed in the first resistor formation portion A, the second resistor formation portion B, and the capacitance element formation portion C. Then, the above-described structure is patterned by using the hard masks 18a to 18c.

Accordingly, the first resistance metal film 14a can be formed in the first resistor formation portion A, and the second resistance metal film 16b can be formed in the second resistor formation portion B are formed in a single etching process (by use of one kind of hard mask) at the same time. Thus, when two types of resistance metal films including the first resistance metal film 14a and the second resistance metal film 16b are formed on an identical substrate, it is no longer necessary to form masks for every type of the resistance metal films or to carry out the etching process every time as in a prior art technology.

Therefore, according to the manufacturing method of the semiconductor device 1 in the present embodiment, even if the semiconductor device including two types of resistors on the identical substrate is manufactured, it is possible to reduce the number of the manufacturing processes of the semiconductor device, as compared to the number of the manufacturing processes in a prior art technology. As a result, it is possible to reduce the manufacturing cost of the semiconductor device, as compared to the manufacturing cost in a prior art technology.

(2) In the manufacturing method of the semiconductor device 1 in the present embodiment, in the capacitance element formation portion C, manufacturing processes of the resistance element R1 and the resistance element R2 are carried out, respectively.

Accordingly, the capacitance element C1 can be formed such that the first insulating film (capacitance film) 15c is interposed by the first resistance metal film 14c and the second resistance metal film 16c, in the capacitance element formation portion C. Therefore, it is possible to manufacture the semiconductor device 1 having three types of elements that are the capacitance element C1, the first resistance element R1, and the second resistance element R2.

(3) In the manufacturing method of the semiconductor device 1 in the present embodiment, a TiN resistance metal film is formed as the first resistance metal films 14a to 14c, and a TaN resistance metal film is formed as the second resistance metal films 16a to 16c, so that the first insulating films 15a to 15c and the second insulating films 17a to 17c are each formed with a SiN film.

Therefore, it is possible to manufacture the semiconductor device 1 having two types of resistors of the TaN resistance metal film and the TiN resistance metal film, which are different in sheet resistance value, on an identical substrate.

(4) In the manufacturing method of the semiconductor device 1 in the present embodiment, when the first resistance metal film 14f, the first insulating film 15f, the second resistance metal film 16f, and the second insulating film 17f are etched, a halogen-based gas is used as an etching gas.

Accordingly, the first resistance metal film 14f, the first insulating film 15f, the second resistance metal film 16f, and the second insulating film 17f can be etched continuously in a sequential manner, so that the first resistance metal films 14a to 14c, the first insulating films 15a to 15c, the second resistance metal films 16a to 16c, and the second insulating films 17a to 17c can be formed efficiently.

(Modifications)

In the above-described embodiment, a description has been given to a case where three types of elements including the first resistance element R1, the second resistance element R2, and the capacitance element C1 are formed on an identical substrate. However, the present disclosure is not limited to this. For example, two types of elements may be formed on the identical substrate by forming the first resistance element R2 in a first region of the substrate, and forming the second resistance element R1 in a second region of the substrate. Also, two types of elements may be formed on the identical substrate by forming the capacitance element C1 is in the first region of the substrate, and forming the first resistance element R1 in the second region of the substrate. Alternatively, two types of elements may be formed on the identical substrate by forming the first resistance element R1 in the first region of the substrate, and forming the capacitance element C1 in the second region of the substrate.

Further, in the above-described embodiment, a description has been given of a case where the capacitance element C1 includes a pair of lower metal plugs 13c and a pair of upper metal plugs 21c. However, the present disclosure is not limited to this. For example, any capacitance element C1 should only include a single lower metal plug 13c and a single upper metal plug 21c.

Furthermore, in the above-described embodiment, a description has been given of a case where the TiN resistance metal film is formed as the first resistance metal films 14a to 14c, and the TaN resistance metal film is formed as the second resistance metal films 16a to 16c. However, the present disclosure is not limited to this. For example, a TaN resistance metal film may be formed as the first resistance metal films 14a to 14c and a TiN resistance metal film may be formed as the second resistance metal films 16a to 16c. In addition, the first resistance metal films 14a to 14c and the second resistance metal films 16a to 16c are not limited to TaN or TiN, but may be another metal-based material. The first resistance metal films 14a to 14c and the second resistance metal films 16a to 16c maybe films made of any one of, for example, metal films, metal nitride films, or metal silicide films, each including TaN or TiN.

In one embodiment of the present disclosure, there is provided a semiconductor device, including: a first metal wiring layer formed on a semiconductor substrate; an interlayer insulating film formed on the first metal wiring layer; a second metal wiring layer formed on the interlayer insulating film; a first resistor including a first resistance metal film formed between the first metal wiring layer and the second metal wiring layer, a first insulating film formed on the first resistance metal film, and a second resistance metal film formed on the first insulating film and being different in a sheet resistance from the first resistance metal film; and a second resistor including a third resistance metal film formed between the first metal wiring layer and the second metal wiring layer, a second insulating film formed on the third resistance metal film, and a fourth resistance metal film formed on the second insulating film and being different in the seat resistance from the third resistance metal film; wherein the first resistance metal film and the third resistance metal film are made of a same material, and wherein the second resistance metal film and the fourth resistance metal film are made of a same material.

In addition, in the above-described semiconductor device, in the first resistor, the second resistance metal film and the second metal wiring layer may not be connected with each other, and the first resistance metal film and the first metal wiring layer may be connected with each other.

Further, in the above-described semiconductor device, in the second resistor, the third resistance metal film and the first metal wiring layer may not be connected with each other, and the fourth resistance metal film and the second metal wiring layer may be connected with each other.

Furthermore, in the above-described semiconductor device, in the second resistor, the first resistance metal film and the third resistance metal film may be formed in a same layer, the first insulating film and the second insulating film are formed in a same layer, and the second resistance metal film and the fourth resistance metal film may be formed in a same layer.

In addition, in the above-described semiconductor device, the interlayer insulating film may include a first interlayer insulating film, and a second interlayer insulating film formed on the first interlayer insulating film, and the first resistance metal film and the third resistance metal film may be formed on the first interlayer insulating film.

Further, in the above-described semiconductor device, the third insulating film may be formed on the second resistance metal film and the fourth resistance metal film.

Furthermore, in the above-described semiconductor device, the first resistor may be formed by connecting the first resistance metal film and the first metal wiring layer through a lower metal plug, and the second resistor may be formed by connecting the fourth resistance metal film and the second metal wiring layer through an upper metal plug.

Further, in the above-described semiconductor device, the first resistance metal film and the third resistance metal film may be any one of a metal film, a metal nitride film, and a metal silicide film, each including titanium nitride or tantalum nitride, and the second resistance metal film and the fourth resistance metal film may be any one of a metal film, a metal nitride film, and a metal silicide film, each including titanium nitride or tantalum nitride, and are different in the sheet resistance from the first resistance metal film or the third resistance metal film.

Furthermore, the above-described semiconductor device may further include: a lower metal film formed between the first metal wiring layer and the second metal wiring layer; a capacitance insulating film formed on the lower metal film; and a capacitance element formed on the capacitance insulating film and having an upper metal film that is different in the sheet resistance from the lower part metal, and the capacitance element is formed by connecting the lower metal film and the first metal wiring layer and connecting the upper metal film and the second metal wiring layer.

In another embodiment of the present disclosure, there is provided a semiconductor device, including: a first resistor including a first resistance metal film formed between a lower wiring layer formed on a semiconductor substrate and an upper wiring layer, a first insulating film formed on the first resistance metal film, and a second resistance metal film formed on the first insulating film and having a second resistance metal film that is different in a sheet resistance from the first resistance metal film; a second resistor including a third resistance metal film formed between the lower wiring layer formed on the semiconductor substrate and the upper wiring layer, a second insulating film formed on the third resistance metal film, and a fourth resistance metal film formed on the second insulating film and being different in the sheet resistance from the third resistance metal film, wherein in the first resistor, the second resistance metal film and the wiring layer are not connected with each other through an upper metal plug, and the first resistance metal film and the lower wiring layer are connected with each other through a lower metal plug, wherein in the second resistor, the third resistance metal film and the lower wiring layer are not connected with each other through the lower metal plug, and the fourth resistance metal film and the upper wiring layer are connected with each other through the upper metal plug.

In another embodiment of the present disclosure, there is provided a manufacturing method of a semiconductor device including a first resistor formed in a first region and a second resistor formed in a second region that are arranged on an identical substrate, the manufacturing method including: forming a first metal wiring layer on the substrate; forming a first interlayer insulating film on the identical substrate to cover the first metal wiring layer; forming the first metal plug penetrating through the first interlayer insulating film to be connected with the first metal wiring layer in the first region; forming the first resistance metal film on the first interlayer insulating film; forming the first insulating film on the first resistance metal film; forming the second resistance metal film on the first insulating film, the second resistance metal film being different in a sheet resistance from the first resistance metal film; forming the second insulating film on the second resistance metal film; etching the first resistance metal film, the first insulating film, the second resistance metal film, and the second insulating film formed in a region other than the first region and the second region, to form simultaneously the first resistor in which the first resistance metal film, the first insulating film, the second resistance metal film, and the second insulating film are laminated in the first region and the second resistor in which the first resistance metal film, the first insulating film, the second resistance metal film, and the second insulating film are laminated in the second region; forming the second interlayer insulating film on the first interlayer insulating film, the second interlayer insulating film covering the first resistor and the second resistor; and forming the second metal plug in the second region, the second metal plug being exposed to a surface of the second interlayer insulating film to connect the second metal plug with the second resistance metal film, and forming the second metal wiring layer on the second interlayer insulating film to connect the second metal wiring layer with the second metal plug.

In addition, in the above-described manufacturing method, in the first resistor, the second resistance metal film and the second metal wiring layer may not be connected with each other, and the first resistor is formed by connecting the first resistance metal film and the first metal wiring layer through the first metal plug, and in the second resistor, the first resistance metal film and the first metal wiring layer are not connected with each other, and the second resistance metal film and the second metal wiring layer may be connected through the second metal plug.

Further, the above-described manufacturing method may further include forming hard masks in the first region and the second region on the second insulating layer, respectively, after forming the second insulating film and before simultaneously forming the first resistor and the second resistor; and carrying out etching the hard masks.

In another embodiment of the present disclosure, there is provided a manufacturing method of a semiconductor device comprising a first resistor formed in a first region, a second resistor formed in a second region, and a capacitance element formed in a third region that are provided on an identical substrate, the manufacturing method including: forming the first metal wiring layer on the identical substrate; forming a first interlayer insulating film on the identical substrate to cover the first metal wiring layer; forming first metal plugs in the first region and the third region, respectively, the first metal plugs penetrating through the first interlayer insulating film to be connected with the first metal wiring; forming the first resistance metal film on the first interlayer insulating film; forming the first insulating film on the first resistance metal film; forming the second resistance metal film on the first insulating film, the second resistance metal film being different in a sheet resistance from the first resistance metal film; forming the second insulating film on the second resistance metal film; etching the first resistance metal film, the first insulating film, the second resistance metal film, and the second insulating film formed in a region other than the first region, the second region, and the third region, to simultaneously form the first resistor in which the first resistance metal film, the first insulating film, the second resistance metal film, and the second insulating film are laminated in the first region, the second resistor in which the first resistance metal film, the first insulating film, the second resistance metal film, and the second insulating film are laminated in the second region, and the capacitance element in which the first resistance metal film, the first insulating film, the second resistance metal film, and the second insulating film are laminated in the third region; forming a second interlayer insulating film on the first interlayer insulating film to cover the first resistor, the second resistor, and the capacitance element; forming second metal plugs in the second region and the third region, respectively, the second metal plugs being exposed to a surface of the second interlayer insulating film and being connected with the second resistance metal film; and forming the second metal wiring layer on the second interlayer insulating film, the second metal wiring layer being connected to the second metal plugs.

In addition, the manufacturing method may further include: forming hard masks in the first region and the second region on the second insulating layer, respectively, after forming the second insulating film and before simultaneously forming the first resistor, the second resistor, and the capacitance element; and carrying out the etching by use of the hard masks.

Further, in the above-described manufacturing method, an etching gas used for the etching may be a halogen-based gas.

Furthermore, in the above-described manufacturing method, the first resistance metal film may be any one of a metal film, a metal nitride film, or a metal silicide film, each including titanium nitride or tantalum nitride, and the second resistance metal film may be any one of a metal film, a metal nitride film, or a metal silicide film, each including titanium nitride or tantalum nitride, and is different in the sheet resistance from the first resistance metal film.

Advantageous Effects

According to the present disclosure, it is made possible to easily change which one of the resistance value of the first resistor or the resistance value of the second resistance metal film is made available, by changing the location of the upper metal plug or the lower metal plug.

In addition, the first resistance metal film, the first insulating film, the second resistance metal film, and the second insulating film are sequentially laminated on the first interlayer insulating film, and one kind of mask is formed on first and second regions in such a laminated structure. Then, the first resistor is formed in the first region and the second resistor is formed in the second region in a single etching process of etching the above structure by use of the above mask.

Accordingly, when two types of resistors including the first resistor and the second resistor are formed on an identical substrate, it is no longer necessary to form the mask for each type of the resistors or to carry out the etching every time as in one technology. Therefore, according to the present disclosure, even in a case where the semiconductor device including plural types of resistors on an identical substrate is manufactured, it is possible to reduce the number of manufacturing processes of the semiconductor device as compared to that in one technology.

REFERENCE SIGNS LIST 1 semiconductor device
10 substrate
11 lower wiring layer
12 first interlayer insulating film
13 lower metal plug
14 first resistance metal film
15 first insulating film
16 second resistance metal film
17 second insulating film
18 hard mask
19 resist mask
20 second interlayer insulating film
21 upper metal plug
22 metal plug
23 upper wiring layer
A first resistor formation portion
B second resistor formation portion
C capacitance element formation portion
R1 first resistance element
R2 second resistance element
C1 capacitance element

The invention claimed is:

1. A semiconductor device, comprising:
a first metal wiring layer formed on a substrate;
an interlayer insulating film formed on the first metal wiring layer;
a second metal wiring layer formed on the interlayer insulating film;
a first resistor including a first resistance metal film formed between the first metal wiring layer and the second metal wiring layer, a first insulating film formed on the first resistance metal film, and a second resistance metal film formed on the first insulating film and being different in a sheet resistance from the first resistance metal film; and
a second resistor including a third resistance metal film formed between the first metal wiring layer and the second metal wiring layer, a second insulating film formed on the third resistance metal film, and a fourth resistance metal film formed on the second insulating film and being different in a sheet resistance from the third resistance metal film;
wherein the interlayer insulating film includes a first interlayer insulating film and a second interlayer insulating film formed on the first interlayer insulating film,
wherein the first resistance metal film and the third resistance metal film are formed on the first interlayer insulating film,
wherein the second metal wiring layer is formed on the second interlayer insulating film,
wherein the first resistor is formed by connecting the first resistance metal film and the first metal wiring layer through two lower metal plugs that only penetrate through the first interlayer insulating film such that the entire second resistance metal film is electrically insulated by only contacting with surrounding first dielectric materials,
wherein the second resistor is formed by connecting the fourth resistance metal film and the second metal wiring layer through two upper metal plugs that only penetrate through the second interlayer insulating film such that the entire third resistance metal film is electrically insulated by only contacting with surrounding second dielectric materials,
wherein the first resistance metal film and the third resistance metal film are made of a same material, and
wherein the second resistance metal film and the fourth resistance metal film are made of a same material.

2. The semiconductor device according to claim 1, wherein in the first resistor, the second resistance metal film and the second metal wiring layer are not connected with each other.

3. The semiconductor device according to claim 1, wherein in the second resistor, the third resistance metal film and the first metal wiring layer are not connected with each other.

4. The semiconductor device according to claim 1, wherein the first resistance metal film and the third resistance metal film are formed in a same layer, the first insulating film and the second insulating film are formed in a same layer, and the second resistance metal film and the fourth resistance metal film are formed in a same layer.

5. The semiconductor device according to claim 1, wherein a third insulating film is formed on the second resistance metal film and a fourth insulating film is formed on the fourth resistance metal film.

6. The semiconductor device according to claim 1,
wherein the first resistance metal film and the third resistance metal film are any one of a metal film, a metal nitride film, and a metal silicide film, each including titanium nitride or tantalum nitride, and wherein the second resistance metal film and the fourth resistance metal film are any one of a metal film, a metal nitride film, and a metal silicide film, each including titanium nitride or tantalum nitride, and are different in the sheet resistance from the first resistance metal film or the third resistance metal film.

7. The semiconductor device according to claim 1, further comprising:
   a lower metal film formed between the first metal wiring layer and the second metal wiring layer;
   a capacitance insulating film formed on the lower metal film;
   an upper metal film formed on the capacitance insulating film and being different in a sheet resistance from the lower metal film; and
   a capacitance element is formed by connecting the lower metal film and the first metal wiring layer and connecting the upper metal film and the second metal wiring layer.

* * * * *